United States Patent [19]

MacIver

[11] 4,321,317

[45] Mar. 23, 1982

[54] HIGH RESOLUTION LITHOGRAPHY SYSTEM FOR MICROELECTRONIC FABRICATION

[75] Inventor: Bernard A. MacIver, Lathrup Village, Mich.

[73] Assignee: General Motors Corporation, Detroit, Mich.

[21] Appl. No.: 144,578

[22] Filed: Apr. 28, 1980

[51] Int. Cl.³ .................. B05D 3/06; G03C 5/00
[52] U.S. Cl. ..................... 430/5; 430/296; 430/291; 430/315; 430/317; 430/323; 430/328; 430/394; 430/942; 427/38; 427/43.1
[58] Field of Search ............... 156/643, 659, 628; 427/38, 43.1; 430/5, 291, 296, 321, 317, 323, 328, 942, 394

[56] References Cited

U.S. PATENT DOCUMENTS

| | | | |
|---|---|---|---|
| 3,926,636 | 12/1975 | Barzynski et al. | 156/272 X |
| 3,989,524 | 11/1976 | Palac | 430/5 X |
| 4,018,937 | 4/1977 | Levine | 430/296 |
| 4,068,018 | 1/1978 | Hashimoto et al. | 430/5 |
| 4,078,098 | 3/1978 | Coatellino | 430/5 |
| 4,087,569 | 5/1978 | Hatzakis | 430/296 X |
| 4,211,834 | 7/1980 | Lapadula et al. | 430/5 X |

OTHER PUBLICATIONS

Okuyama et al., "High Dose Ion Implantation into Photoresist", *Journal of Electrochemical Society*, v. 125, n 8, pp. 1293–1298, 8/78.

Oldham, "The Fabrication of Microelectronic Circuits", *Scientific American*, v. 237, n 3, pp. 111–114, 119–124, 126, 128, 9/77.

LeBoss, "Deep UV Option Promotes Fine Lines", *Electronics*, pp. 44–46, 9/79.

*Primary Examiner*—Richard L. Schilling
*Assistant Examiner*—John L. Goodrow
*Attorney, Agent, or Firm*—Robert J. Wallace

[57] ABSTRACT

Master and working photomasks are made using a photoresist darkened on and bonded to respective quartz substrates. The working photomask is formed by deep ultraviolet light exposure through an electron beam patterned master mask. Deep ultraviolet light is also used to pattern a resist on a silicon slice through the working mask. The same resist is preferably used on the slice and both masks.

5 Claims, 1 Drawing Figure

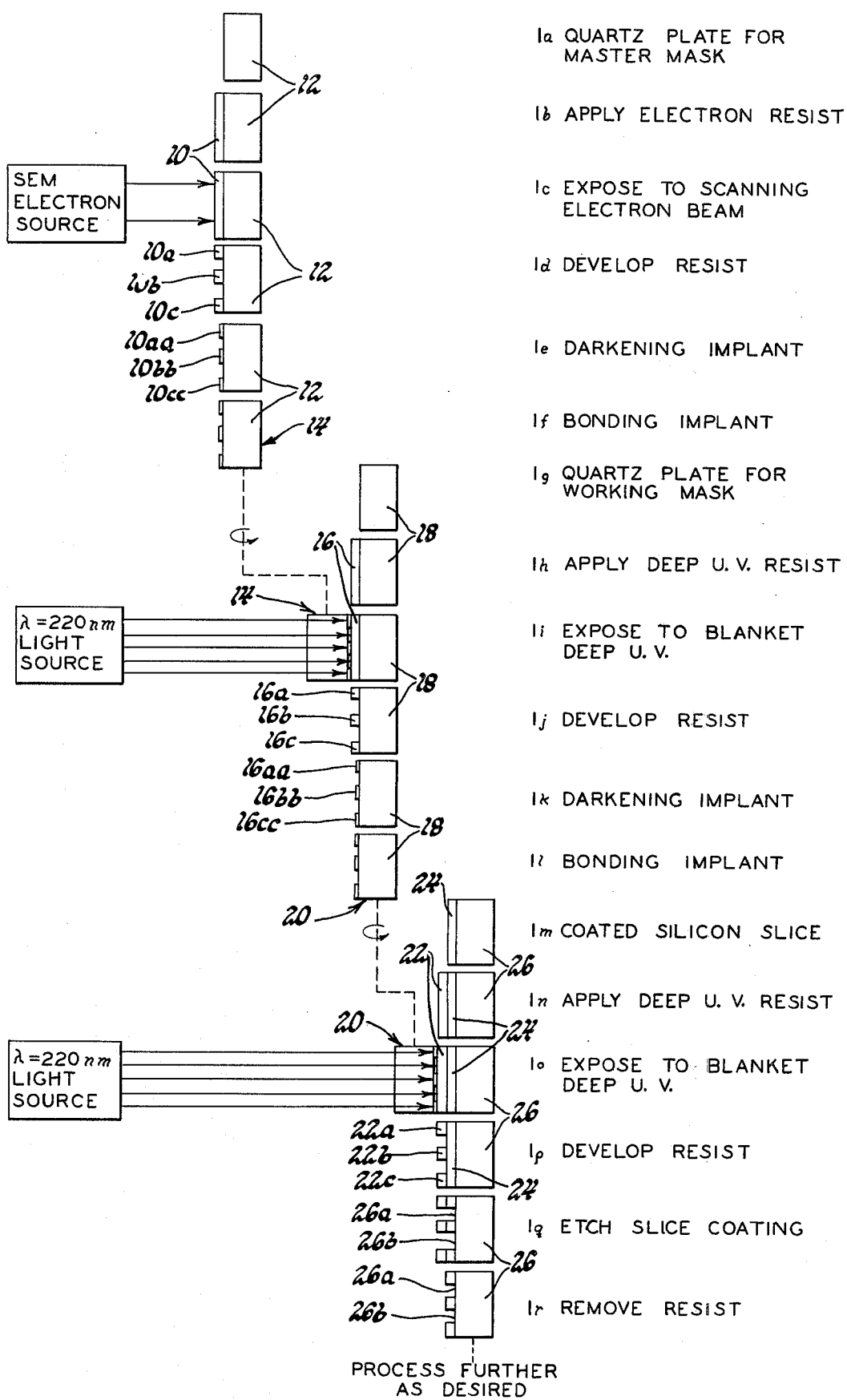

HIGH RESOLUTION LITHOGRAPHY SYSTEM FOR MICROELECTRONIC FABRICATION

RELATED PATENT APPLICATION

This patent application is related to my U.S. patent application Ser. No. 144,579, concurrently filed herewith, that is entitled "High Resolution Photomasks Using Ion Implanted Electron Resist", and is assigned to the same assignee as this patent application.

FIELD OF THE INVENTION

This invention relates to photomasking in the manufacture of integrated circuits. It more particularly relates to an improved photomask system and lithographic process which provides increased dimensional accuracy, lower cost and convenience over conventional photomasking systems and lithographic processes.

BACKGROUND OF THE INVENTION

Integrated circuit semiconductor devices are typically made using photoetching techniques in which a photoresist is exposed to a light source through a working photomask. The working photomask conventionally is a glass plate having a pattern of opaque areas photographically developed thereon. It is formed by irradiating a photodarkenable emulsion on the glass plate through a master mask that has been made by photoetching techniques. The master mask usually is made by a more expensive process that involves photoetching a chromium layer on a glass substrate. The resist used to etch the chromium layer does not have to be opaque. Accordingly, it does not need to contain grains of a material which will darken upon irradiation and development. Accordingly, where extremely high dimensional accuracy is desired, one may choose to use a chromium photomask as the actual working mask. However, working masks, especially contact working masks, tend to deteriorate with use. Use of the more expensive chromium masks as working masks is ordinarily economically impractical, especially if they are to be used as contact working masks.

A recent report discloses using a normally transparent photoetching photoresist, such as Shipley's AZ-1350 and Tokyo Oka Kogyo's OMR-83 or OSR, as an opaque emulsion for a working mask. The report indicated that the photoresist was hardened by ion implantation and optically darkened enough to block out ultraviolet light above wave lengths of 300 nanometers. The resultant film therefore did not require grains of photodarkening material to produce opacity. Film pattern resolution is therefore not limited by the size of such grains, and dimensional accuracy is improved. In addition, the cost of making the photomask is reduced, as compared to photoetching processes.

The aforementioned photoresist films have base polymers that are respectively cresol novolac resin, cyclized polyisoprene, and poly (-vinyloxethyl cinnamate). Such photoresists are sensitive to visible light and to near ultraviolet light. Upon exposure to such light, through a mask, a pattern is activated in the transparent resist. The exposed portions of the film are selectively washed away when the film is rinsed in an appropriate solvent. Patterned photoresist coatings of up to about 4000 angstroms were darkened and hardened by ion implantation at energies of about 20–180 keV at a rate of about 0.16–1.25 microamperes per square centimeter in dosages of about $10^{14}$–$10^{16}$ ions per square centimeter.

In my aforementioned concurrently filed U.S. patent application Ser. No. 144,579, disclose how an electron sensitive resist can also be satisfactorily darkened to ultraviolet radiation and made scratch resistant by ion implantation. Electron sensitive resists are of interest because they can be patterned by a 0.1 micrometer wide electron beam, which inherently produces very high resolutions. However, a thicker coating and a different ion implantation procedure is required to darken and harden the electron resist. In Ser. No. 144,579 I propose a two-stage ion implantation process that initially darkens and hardens the electron resist, and then makes it extremely adherent to its glass substrate. Since the resist pattern is delineated by electron irradiation, an extremely high degree of dimensional accuracy is inherently available. My two-step ion implantation process does not significantly degrade it. Consequently, extremely narrow line widths, i.e. of the order of 0.5 micrometer and less, can be readily obtained. Master photomasks of high dimensional accuracy are obtained, in a simple process, suitable for use as master photomasks. Such master photomasks can also be used as working photomasks, if desired. However, it is quite costly to generate the pattern in the resist by electron beam irradiation. Hence, use of an electron beam generated photomask as a working mask is not practical at this time.

On the other hand, it has recently been reported that the electron resists such as polymethyl methacrylate (PMMA) and polymethyl-isopropenyl-ketone (PMIK) can be satisfactorily activated by deep ultraviolet light sources, 220 nanometers and 253.3 nanometers in wave length, respectively. My two-stage ion implantation of Ser. No. 144,579 can be used on such resists, regardless as to whether they have been patterned by electron beam or ultraviolet radiation. Pattern definition by ultraviolet radiation cannot provide as fine a resolution as obtained by electron beam irradiation. However, it is a considerably quicker and less expensive process, and the resolutions attainable are more than adequate for most present integrated circuit designs. The deep ultraviolet radiation to which PMMA and PMIK are sensitive inherently provides almost twice the resolving power resolution as the near ultraviolet radiation now typically used for photoresists such as the aforementioned AZ-1350, OMR-83 or OSR. Hence, I contemplated using my two-stage ion implantation to also make working photomasks of PMMA, PMIK or the like. However, the patterns of the working masks would be generated by ultraviolet radiation, not by an electron beam.

In my aforementioned Ser. No. 144,579, I describe but do not claim using master masks made by my process to produce working masks made by my process. I mentioned that if the resist is implanted as described herein, it will satisfactorily block ultraviolet light down to about 200 nanometers. Using such a short wave length of light to irradiate a resist inherently allows higher resolutions to be obtained. Hence, an extremely fine resolution master photomask made in accordance with this invention can be used with deep ultraviolet light to make a fine resolution working photomask in accordance with this invention. Morever, if this same resist is used on the silicon slice itself, and also irradiated with deep ultraviolet light through the aforementioned working photomask, very high resolutions are readily obtained on the slice itself. This is particularly beneficial because these results are attainable in a contact printing operation. This obviates the need for considerably more expensive projection alignment systems.

OBJECTS AND SUMMARY OF THE INVENTION

It is therefore an object of this invention to provide an improved high resolution mask making process.

Another object of the invention is to provide an improved lithographic process that readily provides high resolutions on silicon slices even with contact printing.

The invention comprehends applying a layer about 0.5–1 micrometer thick of a transparent electron sensitive resist onto a quartz plate. A resist pattern is delineated on the plate by means of an electron sensitive resist onto a quartz plate. A resist pattern is delineated on the plate by means of an electron beam. The patterned resists is then given a two-stage ion implantation. In the first stage the implantation is at a high energy that is optimized to darken the resist. In the second stage the implantation is at a moderate energy optimized to produce highest resist scratch resistance. This forms a very high resolution master photomask. A second quartz plate is coated with a resist responsive to deep ultraviolet light. The latter resist is exposed to deep ultraviolet light through the master photomask in a contact printing operation. The resist is then developed and subjected to a two-stage ion implantation such as described above to form a high resolution working photomask. In my preferred process a silicon slice is then coated with a resist responsive to deep ultraviolet light. This last-mentioned resist is then exposed to deep ultraviolet light through the working photomask in a contact printing operation. The resist is then developed, the slice etched, and the resist then removed for further processing of the slice.

BRIEF DESCRIPTION OF THE FIGURE

Other objects, features and advantages of this invention will become more apparent from the following description of preferred examples thereof, and from the drawing which diagrammatically illustrates a sequence of steps $1a$–$1r$ used in the preferred example of this invention.

DESCRIPTION OF THE PREFERRED EMBODIMENTS

In my concurrently filed U.S. patent application Ser. No. 144,579, I describe and claim a two-stage ion implantation process for darkening photoresists to deep ultraviolet light and making such photoresists scratch resistant on their substrates, particularly quartz plates. The process is useful in forming a master photomask that has been precisely defined by an electron beam. However, such masks are expensive and not practical as working photomasks since working photomasks tend to degrade with use. However, I recognize that this same electron resist is also sensitive to deep ultraviolet light and that deep ultraviolet light permits one to obtain a significantly higher resolution than near ultraviolet light.

As can be seen in the drawing, in this patent application I use a master photomask 14, similar to the aforementioned master photomask, to form a working photomask 20 by exposure to deep ultraviolet light. The working photomask 20 is similar to the aforementioned working photomask. Moreover, I can form a high resolution working photomask by simple contact printing instead of by a more expensive projection alignment operation. In such instance the aforementioned master photomask is used as a contact mask for exposing a coating of a deep ultraviolet light sensitive resist on a second quartz plate. After thus patterning the latter resist, it is darkened and made scratch resistant by my aforementioned two-stage ion implantation process. The result is a working photomask that provides high resolution for contact printing operations on a silicon slice. In my lithographic process, a silicon slice is then coated with a resist that is responsive to deep ultraviolet light, and the resist exposed to deep ultraviolet light through the working photomask referred to above. The last-mentioned resist is then developed and the silicon slice etched, retaining high resolution in the etched surface. In my preferred process the same resist is used for both masks and the silicon slice. It is polymethyl methacrylate (PMMA).

The FIGURE illustrates a specific example of my lithographic process. In my process, a 0.8 micrometer thick coating 10 of polymethyl methacrylate (PMMA) positive-type electron resist was applied to a 15 millimeters thick flat, clear and colorless quartz plate 12 in the usual manner. The resist was applied to the plate 12 in liquid form and then the plate spun on an axis normal to its major surface, to get a uniform thin coating. The coated plate was then baked in air at 80° C. for 30 minutes. In step $1c$, selected regions of the resist were then progressively exposed by selective irradiation with a computer controlled 10 keV electron beam in a dosage of about $10^{-6}$ C per square centimeter. The beam source was such as used in a scanning electron microscope and had an electron beam mean diameter of about 0.1 micrometer. This beam was used to expose the resist in a pattern having a minimum line width of about 0.5 micrometer. The exposed resist was then developed by immersion of the irradiated coated plate in methyl-isobutyl-ketone for about 2 minutes at room temperature. The methyl-isobutyl-ketone was manually agitated during this immersion. The portions of the electron resist exposed to the electron beam were dissolved away, leaving a pattern designated at $10a$, $10b$ and $10c$ of transparent electron resist on the quartz plate having a minimum line width of about 0.5 micrometer.

In step $1e$ the quartz plate 12 was then given a uniform ion implantation on its surface having the resist pattern on it. The ion beam was of $^{28}Si^+$ at an energy of approximately 200 keV and a flux of 3 microamperes per square centimeter in a dosage of $5 \times 10^{15}$ silicon ions per square centimeter. It was applied uniformly across the whole surface of plate 10. Patterned resist $10aa$, $10bb$ and $10cc$ darkened and exhibited a transmittancy of about 1.5% and 1% with respect to near and deep ultraviolet light of a wave length of 400 nanometers and 220 nanometers, respectively. The implanted resist shrank in thickness from the original 0.8 micrometer to about 0.16 micrometer. However, only a thickness shrinkage was observed. No significant lateral shrinkage was noticed. Accordingly, the high dimensional accuracy attributable to the electron beam pattern generation was preserved. However, the resist was not scratch resistant.

In step $1f$, the entire aforementioned surface of the quartz plate 12, including the resist, was then given a second uniform implantation with $^{28}Si^+$. However, this time the implantation energy was 100 keV at a flux of 3 micrometers per square centimeter in a dosage of $5 \times 10^{15}$ silicon ions per square centimeter. The dark-exposure but also that it can be used for the working photomask and for the slice etch mask. I further recognize that patterning the working mask and etch mask by deep ultraviolet light permits high resolutions to be obtainable at lower capital investment and operating costs. Still further, the repetitive steps in processing and the repetitive use of the same resist should aid in obtaining higher quality, higher yields, and/or lower cost.

I presume that other electron resists than PMMA can be used for the master photomask, the working photomask and the etch mask. On the other hand, if the same resist is not used in each, the full benefit of repetition in processing is not achieved. Also, other resists may be responsive to slightly longer deep ultraviolet wave lengths, which inherently should provide slightly less accuracy. Also, as to accuracy, I prefer to use minimum line widths of only 0.5 micrometer in the master mask, even though the electron beam is capable of 0.1 micrometer line width. By line width, I mean the width of each of pattern portions 10a, 10b and 10c and, correspondingly, the width of silicon slice surface portions 26a and 26b. For purposes of this description a minimum line width of 0.5 micrometer in the mask is equivalent to a mask resolution of 0.5 micrometer. All one needs is to use a line width below the resolving power of the deep ultraviolet light used. At 220 nanometers, this is about 0.7 micrometer. The photoresist is initially darkened to ultraviolet light of wave lengths down to as low as about 200 nanometers. In order to do this, a resist coating about 0.5–1.0 micrometer thick and a two stage ion implantation of my aforementioned U.S. Ser. No. 144,579 apparently is necessary. The first stage should be at energies of at least about 180 keV to provide complete penetration of the resist. 200 keV is preferred and even higher implantation energies would probably be useful. For the second implantation a moderate energy of about 100–150 keV should be used. It is this second, moderate, implant that provides the scratch resistance desired for both the master and the working photomasks. The implantations should be at energies of at least about 2 microamperes per square centimeter and preferably higher. I prefer, and have mostly used, 3 microamperes per square centimeter. Analogously, implantation should be at dosages of about $10^{15}$–$10^{16}$ ions per square centimeter. Otherwise, sufficient optical density for effective masking is not obtained. On the other hand, dosages in excess of about $5 \times 10^{16}$ ions per square centimeter are generally to be avoided. They do not seem to provide any benefits and in some instances appear to decrease optical density, perhaps due to a back sputtering effect.

The two-stage ion implantation is not believed to be dependent on any particular ion species. $^{31}P^+$, $^{40}Ar^+$, $^{11}B^+$ and $^{49}Bf_2^+$ should work as well as $^{28}Si^+$. I believe that the implantation causes a graphitization of the resist to occur and that this transformation would occur under bombardment with any ion. The graphitization transformation reduces resist thickness to about one fourth or less of its original thickness. I believe the second moderate implant imparts energy at the interface of the graphitized coating that permits it to adhere better to its quartz substrate. An initial resist thickness of at least about 0.5 micrometer is apparently necessary in order to obtain sufficient optical density in the implanted resist. On the other hand, it is difficult to completely penetrate a resist thickness greater than about 1.0 micrometer. On the other hand, if implantation apparatus having energies higher than about 200 keV become commercially available, I may prefer to use greater resist thicknesses for the master photomask 14 and/or the working photomask 20.

Quartz is preferred as the substrate plate in the master photomask 14 and the working photomask 20 because it is transparent to deep ultraviolet light. The glass in plates ordinarily used for current integrated circuit masks will adequately transmit near ultraviolet light but not deep ultraviolet light. On the other hand, if a glass suitably transparent to deep ultraviolet light becomes available, it may be preferred due to lower cost.

The embodiments of the invention in which an exclusive property or privilege is claimed are defined as follows:

1. A lithographic process for manufacturing semiconductor devices that provides etching resist resolutions of about 0.7–1.0 micrometer:
    patterning a transparent resist on a first transparent substrate by exposure to an electron beam;
    subjecting the resist to two successive ion implantations at successively lower energies to successively reduce its transmittancy of deep ultraviolet light and increase its adhesion to its substrate, effective to form a master mask having a resolution below about 0.7 micrometer;
    patterning a transparent resist on a second transparent substrate by exposure to deep ultraviolet light through said master mask;
    subjecting the latter resist to two successive ion implantations to reduce its transmittancy of deep ultraviolet light and increase its adhesion to its substrate, effective to form a working mask having a resolution of about 0.7–1.0 micrometer;
    patterning a transparent resist on a semiconductor material slice by exposure of the last-mentioned resist to deep ultraviolet light through said working mask;
    etching surface portions of said slice not convered by said patterned resist; and removing the patterned resist on said slice for further processing of said slice.

2. A lithographic process for manufacturing semiconductor devices by a combination of electron beam and contact printing that readily provides etching resolutions of about 1.0 micrometer or less on the semiconductor device comprising:
    patterning an electron sensitive resist on a first transparent substrate by exposure to an electron beam;
    subjecting the resist to at least two separate ion implantations at successively lower energies to successively reduce its transmittancy of deep ultraviolet light and increase its adhesion to its substrate, effective to form a master mask having a resolution not higher than about 0.5 micrometer;
    patterning a deep ultraviolet light-sensitive resist on a second transparent substrate by contact printing exposure to deep ultraviolet light through said master mask;
    subjecting the latter resist to at least two separate ion implantations to reduce its transmittancy of deep ultraviolet light and increase its adhesion to its substrate, effective to form a working mask having a resolution not higher than about 1.0 micrometer;
    patterning a deep ultraviolet sensitive resist on a semiconductor material slice by contact printing exposure of the last-mentioned resist to deep ultraviolet light through said working mask, ened resist pattern 10aa, 10bb and 10cc shrank in thickness only slightly, if at all. Thus, dimensional accuracy was still preserved. However, the resist became highly scratch resistant. It appears to be at least comparable to that of chromium on glass and approaches the scratch resistance of glass itself. Transmittancy, however, remained about the same as after the first implantation. The result is a master photomask 14 of extremely high dimensional accuracy. A 0.8 micrometer thick coating of polymethyl methacrylate (PMMA) positive-type electron resist 16 was then applied to a second 15 millimeter thick flat, clear and colorless quartz plate 18 in the same manner as before. The resist was applied to the plate in liquid form and then the plate spun on an axis normal to its major surface, to get a uniform thin coating. The coated plate was then baked in air at 80° C. for 30 minutes. The above-mentioned master photomask 14 was then placed on the coated plate 18 with the dark pattern 10aa, 10bb and 10cc directly in contact with the baked resist 16. A deep ultraviolet light, as for example about 220 nanometers in wave length was then beamed through master photomask 14 onto resist 16. As seen in step 1h, the deep ultraviolet light uniformly irradiated the entire outer surface of master mask 14, so that the aforementioned two-stage ion implanted photoresist pattern 10aa, 10bb and 10cc on its opposite face served as a mask for selected portions of the resist 16 on plate 18. The resist 16 was then developed by immersion in methyl-isobutyl-ketone for about 2 minutes at room temperature with manual agitation. The selected portions of the resist 16 exposed to the deep ultraviolet light were dissolved away in step 1j, leaving a pattern 16a, 16b and 16c of transparent resist on the second quartz plate 18.

In the following step 1k, the second quartz plate 18 was given a uniform ion implantation across its entire patterned surface using $^{28}Si^+$ at an energy of approximately 200 keV a flux of 3 microamperes per square centimeter in a dosage of $5 \times 10^{15}$ silicon ions per square centimeter. As in step 1e, the pattern darkened and exhibited a transmittancy of about 1.5% and 1% with respect to near and deep ultraviolet light of a wave length of about 400 nanometers and 220 nanometers, respectively. The darkened resist pattern is designated by reference numerals 16aa, 16bb and 16cc. The implantation caused the resist 16 to shrink in thickness to about 0.16 micrometer, without any significant lateral shrinkage. Accordingly, the high dimensional accuracy attributable to the deep ultraviolet light irradiation was preserved. However, the resist was not scratch resistant.

The entire aforementioned surface of the quartz plate 18, including patterned resist 16aa, 16bb and 16cc, was then given a second uniform implantation with $^{28}Si^+$, as seen in step 1l. However, this time the implantation energy was 100 keV at a flux of 3 micrometers per square centimeter at a dosage of $5 \times 10^{15}$ silicon ions per square centimeter. Original dimensional accuracy and optical density was preserved, as in step 1f. However, the original dimensional accuracy is about 0.7-1.0 in this photomask, due to the wave length of the radiation used. I believe that a maximum resolution of about 0.7 micrometer is available with radiation of about 220 nanometers in wave length. However, if a high quality deep ultraviolet light source is not used resolution may only be about 1.0 micrometer. In any event, the resist became scratch resistant in step 1l and was comparable to that on mask 14. Hence, a working photomask 20, suitable for contact printing operations, was prepared that had a resolution of the order of about 0.7 micrometer.

To complete the lithographic process, a 150 nanometer thick coating 22 of polymethyl methacrylate (PMMA) positive-type resist was applied to a blanket 200 nanometer thermally formed silicon dioxide coating 24 on a flat silicon slice 26. As previously described, the resist was applied in a liquid state to the silicon slice 26 and the slice spun on an axis normal to its major face to get a uniform thin coating. The coated slice was then baked in air at 80° C. for 30 minutes to dry the resist coating 22. The working photomask 20 was then placed face down on the resist coated silicon slice as shown in step 1n. In this step the darkened pattern 16aa, 16bb and 16cc is placed directly in contact with the resist 22 on the silicon slice 26. The resist coating 22 on the silicon slice 26 was then exposed to a deep ultraviolet light source through the working photomask 20. The ultraviolet light source had a wave length of about 220 nanometers, to provide a resolution in the photoresist on the slice of about 0.7-1.0 micrometer. The resist coated silicon slice was then immersed in methyl-isobutyl-ketone for about 2 minutes at room temperature to develop the resist pattern. As previously mentioned in connection with the master photomask 14 and the working photomask 20, the methyl-isobutyl-ketone was manually agitated during the immersion. Analogously, the portions of the electron resist exposed to the irradiation were dissolved away, leaving a pattern 22a, 22b and 22c of transparent resist on the silicon slice. The resist was sufficiently adherent to the slice to permit the patterned resist 22a, 22b and 22c to protect the oxide coating 24 on the silicon slice for etching in the following step 1q.

The oxide coating 24 was then etched in a conventional manner. For example, and referring now to step 1q, the silicon slice having the patterned resist on it was immersed in a commercially available buffered hydrofluoric acid etchant for a few minutes at room temperature. The slice was manually agitated during this immersion. The portions of the oxide coating 24 not covered by the resist pattern 22a, 22b and 22c were dissolved away, leaving the underlying surface of the silicon slice 26 exposed in a pattern 26a and 26b for further processing. The oxide etchant was then thoroughly rinsed from the silicon slice with deionized water and the slice dried. Flowing dry nitrogen gas over the slice can accelerate drying. The resist pattern 22a, 22b and 22c was then removed by plasma etching in oxygen at a pressure of about $5 \times 10^{-4}$ torr. The slice was then given a more thorough cleaning in successive baths of ammonium hydroxide, hydrogen peroxide, and hydrochloric acid and hydrogen peroxide, with rinses after each bath. The slice was then dried, to yield the oxide patterned slice 26 shown in step 1r. At this point, the silicon slice 26 was ready for further processing such as diffusion, to provide regions of opposite conductivity type in the surface regions 26a and 26b of the slice that were exposed by the aforementioned oxide etching. As usual, steps 1a–1l would be repeated for each mask needed to make an integrated circuit. Similarly, steps 1m–1r would be repeated with each mask made in accordance with steps 1a–1l.

In this invention I recognize that PMMA can be used not only as an electron responsive resist but also as a deep ultraviolet light responsive resist. I recognize that the PMMA cannot only be used in making an extremely high resolution master photomask by electron beam removing the last-mentioned patterned resist from said slice for further processing of said slice, wherein the resist on the slice has a resolution of not higher than about 1.0 micrometer;

etching surface portions of said slice not covered by its patterned resist; and removing the patterned resist on said slice for further processing of said slice.

3. A lithographic system for manufacturing semiconductor devices that provides resolutions below about 1.0 micrometer for etching of a silicon slice surface comprising:

patterning a first PMMA resist coating on a first quartz substrate by exposure to an electron beam having a mean diameter of not greater than about 0.1 micrometer;

giving the resist two successive ion implantations, the first of which reduces its transmittancy of ultraviolet light below about 250 nanometers in wavelength and the second of which increases resist adhesion to the quartz substrate without appreciably darkening the resist, effective to form a master mask having a resolution below about 0.5 micrometer;

patterning a second PMMA resist coating on a second quartz substrate by exposure of the second PMMA resist coating to ultraviolet light below a wavelength of about 250 nanometers through said master mask without image projection through a lens between said master mask and said second PMMA resist coating;

giving the resist two successive ion implantations similar to those given the first resist coating, for reducing transmittancy of ultraviolet light below about 250 nanometers in wavelength and for increasing resist adhesion to its quartz substrate, effective to form a working mask having a resolution of the order of 0.7 micrometer; and patterning a third PMMA resist coating on a silicon slice by exposure of the third PMMA resist coating to ultraviolet light below about 250 nanometers in wavelength without image projection through a lens between said working mask and said third PMMA resist coating, whereby an etch pattern is formed on the slice with resolutions of the order of 0.7 micrometer.

4. A method of making a contact printable integrated circuit mask having a resolution of below about 1.0 micrometer comprising:

patterning an electron-sensitive resist on a first transparent substrate by exposure to an electron beam;

subjecting the resist to at least two separate ion implantations of successively lower energy that, respectively, reduce its transmittancy of deep ultraviolet light and increase its adhesion to its substrate, effective to form a master mask having a resolution up to about 0.7 micrometer;

patterning a deep ultraviolet light-sensitive resist on a second transparent substrate by contact printing exposure to deep ultraviolet light through said master mask; and subjecting the latter resist to at least two separate ion implantations that, respectively, reduce its transmittancy of deep ultraviolet light and increase its adhesion to its substrate, effective to form a working mask having a resolution below about 1.0 micrometer and practical for contact printing applications.

5. A method of making a working mask suitable for contact printing of integrated circuit patterns or silicon slices with resolutions of the order of about 0.7 micrometer:

patterning a first PMMA resist coating on a first quartz substrate by exposure to an electron beam having a mean diameter of the order of 0.1 micrometer;

subjecting the resist to two successive ion implantations at successively lower energies to successively reduce its transmittancy of ultraviolet light below about 250 nanometers in wavelength and increase its adhesion to the quartz substrate, effective to form a master mask having a resolution not greater than about 0.5 micrometer;

patterning a second PMMA resist coating on a second quartz substrate by exposure of the second PMMA resist coating to ultraviolet light of a wavelength below about 250 nanometers through said master mask without image projection through a lens between said master mask and said second PMMA resist coating; and subjecting the second PMMA resist coating to two successive ion implantations substantially similar to the aforementioned two successive ion implantations to reduce its transmittancy of ultraviolet light below about 250 nanometers and increase its adhesion to its quartz substrate, effective to form a working mask having a resolution of the order of about 0.7 micrometer.

* * * * *

UNITED STATES PATENT AND TRADEMARK OFFICE
CERTIFICATE OF CORRECTION

PATENT NO. : 4,321,317

DATED : March 23, 1982

INVENTOR(S) : Bernard A. MacIver

It is certified that error appears in the above—identified patent and that said Letters Patent is hereby corrected as shown below:

Column 3, lines 14, 15 and 16, delete "is delineated on the plate by means of an electron sensitive resist onto a quartz plate. A resist pattern".

Bridging columns 8, 9 and 10, delete claims 1 through 5 and substitute the following claims:

1. A lithographic process for manufacturing semiconductor devices that provides etching resist resolutions of about 0.7 - 1.0 micrometer:
   patterning a transparent coating at least about 0.5 micrometer thick of a methacrylate-type resist on a first transparent substrate by exposure of the resist to an electron beam and development of the resist;
   subjecting the resist to two successive ion implantations at successively lower energies to successively reduce its transmittancy of deep ultraviolet light and increase its adhesion to its substrate, effective to form a master mask having a resolution below about 0.7 micrometer;
   patterning a second transparent coating at least about 0.5 micrometer thick of a methacrylate-type resist on a

UNITED STATES PATENT AND TRADEMARK OFFICE
CERTIFICATE OF CORRECTION

PATENT NO. : 4,321,317
DATED : March 23, 1982
INVENTOR(S) : Bernard A. MacIver

It is certified that error appears in the above—identified patent and that said Letters Patent is hereby corrected as shown below:

second transparent substrate by exposure to deep ultraviolet light through said master mask and development of the second resist;

subjecting the latter resist to two successive ion implantations to reduce its transmittancy of deep ultraviolet light and increase its adhesion to its substrate, effective to form a working mask having a resolution of about 0.7 - 1.0 micrometer;

patterning a transparent resist on a semiconductor material slice by exposure of the last-mentioned resist to deep ultraviolet light through said working mask and developing said last-mentioned resist;

etching surface portions of said slice not covered by the last-mentioned pattern resist; and then completely removing the last-mentioned patterned resist from said slice for further processing of said slice.

2. A lithographic process for manufacturing semiconductor devices by a combination of electron beam and contact printing that readily provides etching

UNITED STATES PATENT AND TRADEMARK OFFICE
CERTIFICATE OF CORRECTION

PATENT NO. : 4,321,317  Page 3 of 8
DATED : March 23, 1982
INVENTOR(S) : Bernard A. MacIver It is certified that error appears in the above—identified patent and that said Letters Patent is hereby corrected as shown below:

resolutions of about 1.0 micrometer or less on the semiconductor device comprising:

patterning a coating at least about 0.5 micrometer thick of an electron sensitive resist of the methacrylate type on a first transparent substrate by exposure of the resist to an electron beam and development of the resist;

subjecting the resist to at least two separate ion implantations at successively lower energies to successively reduce its transmittancy of deep ultraviolet light and increase its adhesion to its substrate, effective to form a master mask having a resolution not higher than about 0.5 micrometer;

patterning a deep ultraviolet light-sensitive resist at least about 0.5 micrometer thick on a second transparent substrate by contact printing exposure of the latter resist to deep ultraviolet light through said master mask and development of the latter resist;

subjecting the latter resist to at least two separate ion implantations to reduce its transmittancy of deep ultraviolet light and increase its adhesion to its substrate, effective to form a working mask having a resolution not higher than about 1.0 micrometer;

UNITED STATES PATENT AND TRADEMARK OFFICE
CERTIFICATE OF CORRECTION

PATENT NO. : 4,321,317

DATED : March 23, 1982

INVENTOR(S) : Bernard A. MacIver

It is certified that error appears in the above—identified patent and that said Letters Patent is hereby corrected as shown below:

patterning a deep ultraviolet sensitive resist on a semiconductor material slice by contact printing exposure of the last-mentioned resist to deep ultraviolet light through said working mask and development of the last-mentioned resist, wherein the resist on the slice has a resolution not higher than about 1.0 micrometer;

etching surface portions of said slice not covered by its patterned resist; and then completely removing the patterned resist on said slice for further processing of said slice.

3. A lithographic system for manufacturing semiconductor devices that provides resolutions below about 1.0 micrometer for etching of a silicon slice surface comprising:

patterning a first PMMA resist coating at least about 0.5 micrometer thick on a first quartz substrate by exposure to an electron beam having a mean diameter of not greater than about 0.1 micrometer and development of the resist;

UNITED STATES PATENT AND TRADEMARK OFFICE
CERTIFICATE OF CORRECTION

PATENT NO. : 4,321,317

DATED : March 23, 1982

INVENTOR(S) : Bernard A. MacIver

It is certified that error appears in the above—identified patent and that said Letters Patent is hereby corrected as shown below:

giving the resist two successive ion implantations, the first of which reduces its transmittancy of ultraviolet light below about 250 nanometers in wavelength and the second of which increases resist adhesion to the quartz substrate without appreciably darkening the resist, effective to form a master mask having a resolution below about 0.5 micrometer;

patterning a second PMMA resist at least about 0.5 micrometer thick on a second quartz substrate by exposure of the second PMMA resist coating to ultraviolet light below a wavelength of about 250 nanometers through said master mask, without image projection through a lens between said master mask and said second PMMA resist coating, and development of the second PMMA resist;

giving the resist two successive ion implantations similar to those given the first resist coating, for reducing transmittancy of ultraviolet light below about 250 nanometers in wavelength and for increasing resist adhesion to its quartz substrate, effective to form a working mask having a resolution of the order of 0.7 micrometer; and

UNITED STATES PATENT AND TRADEMARK OFFICE
CERTIFICATE OF CORRECTION

PATENT NO. : 4,321,317

DATED : March 23, 1982

INVENTOR(S) : Bernard A. MacIver

It is certified that error appears in the above—identified patent and that said Letters Patent is hereby corrected as shown below:

patterning a third PMMA resist coating on a silicon slice by exposure of the third PMMA resist coating to ultraviolet light below about 250 nanometers in wavelength without image projection through a lens between said working mask and said third PMMA resist coating and then development of the third PMMA resist, whereby an etch pattern is formed on the slice with resolutions of the order of 0.7 micrometer.

4. A method of making a contact printable integrated circuit mask having a resolution of below about 1.0 micrometer comprising:

patterning a coating about 0.5 - 1.0 micrometer thick of an electron-sensitive resist of the methacrylate type on a first transparent substrate by exposure to an electron beam and development of the resist;

subjecting the resist to at least two separate ion implantations of successively lower energy that, respectively, reduce its transmittancy of deep ultraviolet light and increase its adhesion to its substrate, effective to form a master mask having a resolution up to about 0.7 micrometer;

UNITED STATES PATENT AND TRADEMARK OFFICE
CERTIFICATE OF CORRECTION

PATENT NO. : 4,321,317
DATED : March 23, 1982
INVENTOR(S) : Bernard A. MacIver

It is certified that error appears in the above—identified patent and that said Letters Patent is hereby corrected as shown below:

patterning a coating about 0.5 - 1.0 micrometer thick of a deep ultraviolet light-sensitive resist of the methacrylate type on a second transparent substrate by contact printing exposure to deep ultraviolet light through said master mask; and
    subjecting the latter resist to at least two separate ion implantations that, respectively, reduce its transmittancy of deep ultraviolet light and increase its adhesion to its substrate, effective to form a working mask having a resolution below about 1.0 micrometer and practical for contact printing applications.

5. A method of making a working mask suitable for contact printing of integrated circuit patterns or silicon slices with resolutions of the order of about 0.7 micrometer:
    patterning a first PMMA resist coating about 0.5 - 1.0 micrometer thick on a first quartz substrate by exposure to an electron beam having a mean diameter of the order of 0.1 micrometer and development of the resist;
    subjecting the resist to two successive ion implantations at successively lower energies to successively reduce its

UNITED STATES PATENT AND TRADEMARK OFFICE
CERTIFICATE OF CORRECTION

PATENT NO. : 4,321,317

DATED : March 23, 1982

INVENTOR(S) : Bernard A. MacIver

It is certified that error appears in the above—identified patent and that said Letters Patent is hereby corrected as shown below:

transmittancy of ultraviolet light below about 250 nanometers in wavelength and increase its adhesion to the quartz substrate, effective to form a master mask having a resolution not greater than about 0.5 micrometer;

patterning a second PMMA resist coating about 0.5 - 1.0 micrometer thick on a second quartz substrate by exposure of the second PMMA resist coating to ultraviolet light of a wavelength below about 250 nanometers through said master mask, without image projection through a lens between said master mask and said second PMMA resist coating, and development of the second resist; and subjecting the second PMMA resist coating to two successive ion implantations substantially similar to the aforementioned two successive ion implantations to reduce its transmittancy of ultraviolet light below about 250 nanometers and increase its adhesion to its quartz substrate, effective to form a working mask having a resolution of the order of about 0.7 micrometer.

Signed and Sealed this

Second Day of October 1984

[SEAL]

Attest:

GERALD J. MOSSINGHOFF

*Attesting Officer*     *Commissioner of Patents and Trademarks*